United States Patent
Park et al.

(10) Patent No.: US 11,721,245 B2
(45) Date of Patent: Aug. 8, 2023

(54) DISPLAY DEVICE

(71) Applicant: Samsung Display Co., LTD., Yongin-si (KR)

(72) Inventors: Byeongkyu Park, Daejeon (KR); Sungjune Park, Suwon-si (KR); Suk-Ho Lee, Incheon (KR); Jung-Hun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 168 days.

(21) Appl. No.: 17/245,561

(22) Filed: Apr. 30, 2021

(65) Prior Publication Data

US 2021/0375166 A1    Dec. 2, 2021

(30) Foreign Application Priority Data

Jun. 1, 2020    (KR) .................. 10-2020-0065830

(51) Int. Cl.
  *G06F 1/16*    (2006.01)
  *G09F 9/30*    (2006.01)
  *H04M 1/02*    (2006.01)

(52) U.S. Cl.
  CPC ........... *G09F 9/301* (2013.01); *G06F 1/1616* (2013.01); *H04M 1/0268* (2013.01)

(58) Field of Classification Search
  CPC .... G06F 1/1605; G06F 1/1626; G06F 1/1681; G06F 1/203; G06F 1/16
  See application file for complete search history.

(56) References Cited

U.S. PATENT DOCUMENTS

| 10,171,636 B2 | 1/2019 | Yeo et al. | |
| 2014/0065326 A1* | 3/2014 | Lee | G09F 9/301 428/12 |
| 2016/0155967 A1* | 6/2016 | Lee | H10K 59/40 257/88 |
| 2016/0181345 A1* | 6/2016 | Lee | H05K 1/028 257/40 |

(Continued)

FOREIGN PATENT DOCUMENTS

| CN | 110265470 | 9/2019 |
| EP | 3 564 781 | 11/2019 |

(Continued)

OTHER PUBLICATIONS

Partial European search report for European Patent Application or Patent No. 21176120.0 dated Oct. 29, 2021.

(Continued)

*Primary Examiner* — Abhishek M Rathod
(74) *Attorney, Agent, or Firm* — Kile Park Reed & Houtteman PLLC

(57) ABSTRACT

A display device includes a display panel including a first non-folding area, a second non-folding area, and a folding area disposed between the first non-folding area and the second non-folding area and foldable with respect to a folding axis, an adhesive layer disposed under the display panel, and a support layer disposed under the adhesive layer, the support layer including a first supporter overlapping the first non-folding area and the second non-folding area, and a second supporter overlapping the folding area. The first supporter and the second supporter include different materials from each other.

20 Claims, 17 Drawing Sheets

(56) References Cited

U.S. PATENT DOCUMENTS

| | | | | |
|---|---|---|---|---|
| 2017/0045914 | A1* | 2/2017 | Namkung | G02F 1/133305 |
| 2017/0092884 | A1* | 3/2017 | Zhang | G06F 1/1652 |
| 2017/0187934 | A1* | 6/2017 | Kwak | G06F 1/1605 |
| 2017/0287992 | A1* | 10/2017 | Kwak | H04N 23/57 |
| 2017/0352834 | A1* | 12/2017 | Kim | H10K 50/844 |
| 2019/0259310 | A1* | 8/2019 | Ha | G09F 9/301 |
| 2019/0341566 | A1* | 11/2019 | Lee | B32B 27/08 |
| 2021/0202596 | A1 | 7/2021 | Wang et al. | |

FOREIGN PATENT DOCUMENTS

| | | |
|---|---|---|
| EP | 3 224 827 | 5/2021 |
| KR | 10-1431432 | 8/2014 |
| KR | 10-2017-0111827 | 10/2017 |
| KR | 10-2017-0112790 | 10/2017 |
| KR | 10-2019-0073702 | 6/2019 |
| KR | 10-2019-0088159 | 7/2019 |
| WO | 2016/085182 | 6/2016 |

OTHER PUBLICATIONS

Extended European search report for European Patent Application or Patent No. 21176120.0 dated Mar. 18, 2022.

* cited by examiner

DISPLAY DEVICE

CROSS-REFERENCE TO RELATED APPLICATION(S)

This U.S. non-provisional patent application claims priority to and the benefit of Korean Patent Application No. 10-2020-0065830 under 35 U.S.C. § 119, filed in the Korean Intellectual Property Office (KIPO) on Jun. 1, 2020, the contents of which are incorporated herein by reference.

BACKGROUND

1. Technical Field

The disclosure relates to a display device. More specifically, the disclosure relates to a foldable display device.

2. Description of the Related Art

Various display devices that are applied to multimedia devices, such as televisions, mobile phones, tablet computers, navigation devices, and game devices, are being developed. The display devices include a keyboard or a mouse as their input device. Nowadays, the display devices include an input sensing layer as their input device.

In recent years, various types of display devices other than a flat-panel display device are being researched. For example, various flexible display devices, such as a curved display device, a bendable display device, a foldable display device, a rollable display device, a stretchable display device, or the like, are being developed. Particularly, the foldable display device that is foldable about a folding axis is being developed.

Due to frequent folding operations, some creases occur in the foldable portion of the foldable display device.

SUMMARY

The disclosure provides a display device including a support layer that is capable of preventing creases from being formed in a folding area.

Embodiments of the disclosure provide a display device including a display panel including a first non-folding area, a second non-folding area, and a folding area disposed between the first non-folding area and the second non-folding area and foldable with respect to a folding axis, an adhesive layer disposed under the display panel, and a support layer disposed under the adhesive layer, the support layer including a first supporter overlapping the first non-folding area and the second non-folding area and a second supporter overlapping the folding area. The first supporter and the second supporter include different materials from each other.

A module hole may be formed through the first supporter, the display panel, and the adhesive layer and overlap at least one of the first non-folding area and the second non-folding area.

The display panel may include a non-bending portion and a bending portion bent from the non-bending portion, and the first non-folding area, the second non-folding area, and the folding area may overlap the non-bending portion of the display panel.

The support layer may include an auxiliary supporter disposed on the bending portion, and the auxiliary supporter and the first supporter may include a same material.

The auxiliary supporter may overlap one of the first non-folding area and the second non-folding area.

The first supporter may include a first support portion overlapping the first non-folding area, and a second support portion overlapping the second non-folding area, and each of the first support portion and the second support portion may have an area greater than an area of the second supporter in a plan view.

The first support portion, the second support portion, and the second supporter may have a same thickness in a thickness direction of the display panel.

The display device may further include an antistatic layer including a first coating portion disposed between an upper surface of the first supporter and the adhesive layer, and a second coating portion disposed on a lower surface of the first supporter.

The first supporter may have a thickness greater than a sum of a thickness of the first coating portion and a thickness of the second coating portion in a thickness direction of the display panel.

The display device may further include a camera module that overlaps the module hole and is disposed under the support layer.

The display device may further include a polarizing layer disposed on the display panel, and a window disposed on the polarizing layer. The module hole may penetrate though the polarizing layer.

The first supporter may include a polymer film, and the second supporter may include a glass material.

Embodiments of the disclosure provide a display device including a display panel including a module area and a display area surrounding the module area, an adhesive layer disposed under the display panel, and a support layer disposed under the adhesive layer. A module hole may be formed through the support layer, the adhesive layer, and the display panel and overlap the module area. The support layer may include a first supporter surrounding the module hole in a plan view, and a second supporter disposed adjacent to the first supporter and including a material different from a material of the first supporter.

The display area may include a first non-folding area, a second non-folding area, and a folding area disposed between the first non-folding area and the second non-folding area and foldable with respect to a folding axis, and the module hole may overlap one of the first non-folding area and the second non-folding area.

The first supporter may include a first support portion overlapping a portion of the first non-folding area and a second support portion overlapping a portion of the second non-folding area, and the second supporter may be disposed between the first support portion and the second support portion and overlap the folding area, another portion of the first non-folding area, and another portion of the second non-folding area.

The second supporter may have an area greater than an area of each of the first support portion and the second support portion in a plan view.

The second supporter may overlap each of the first non-folding area, the second non-folding area, and the folding area and surround the first supporter in a plan view.

The first supporter may include polyethylene terephthalate, the second supporter may include a glass material, and the second supporter may have a thickness equal to or greater than about 25 micrometers and equal to or smaller than about 75 micrometers.

Embodiments of the disclosure provide a method of manufacturing a display device. The method may include providing a display panel including a first non-folding area, a second non-folding area, and a folding area disposed between the first non-folding area and the second non-folding area and foldable with respect to a folding axis, disposing a first support portion and a second support portion at a lower portion of the display panel such that the first and second support portions respectively overlap the first non-folding area and the second non-folding area, the first and second support portions comprising a same material, disposing a third support portion at the lower portion of the display panel to overlap the folding area, the third support portion including a material different from a material of the first support portion, and forming a module hole penetrating through the display panel overlapping the first support portion and the first non-folding area by using a laser beam.

The first support portion and the second support portion may be disposed at the lower portion of the display panel by a same process, and the third support portion may be disposed at the lower portion of the display panel by a different process from the first support portion.

According to the above, a main supporter supporting the display panel may include the first and second supporters including different materials from each other. The first supporter may include a material through which the laser beam easily penetrates, and the second supporter may include the glass material to prevent the crease of the display device. Accordingly, the crease occurrence in the folding area of the display device may be prevented overall, and a process efficiency in forming the module hole may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
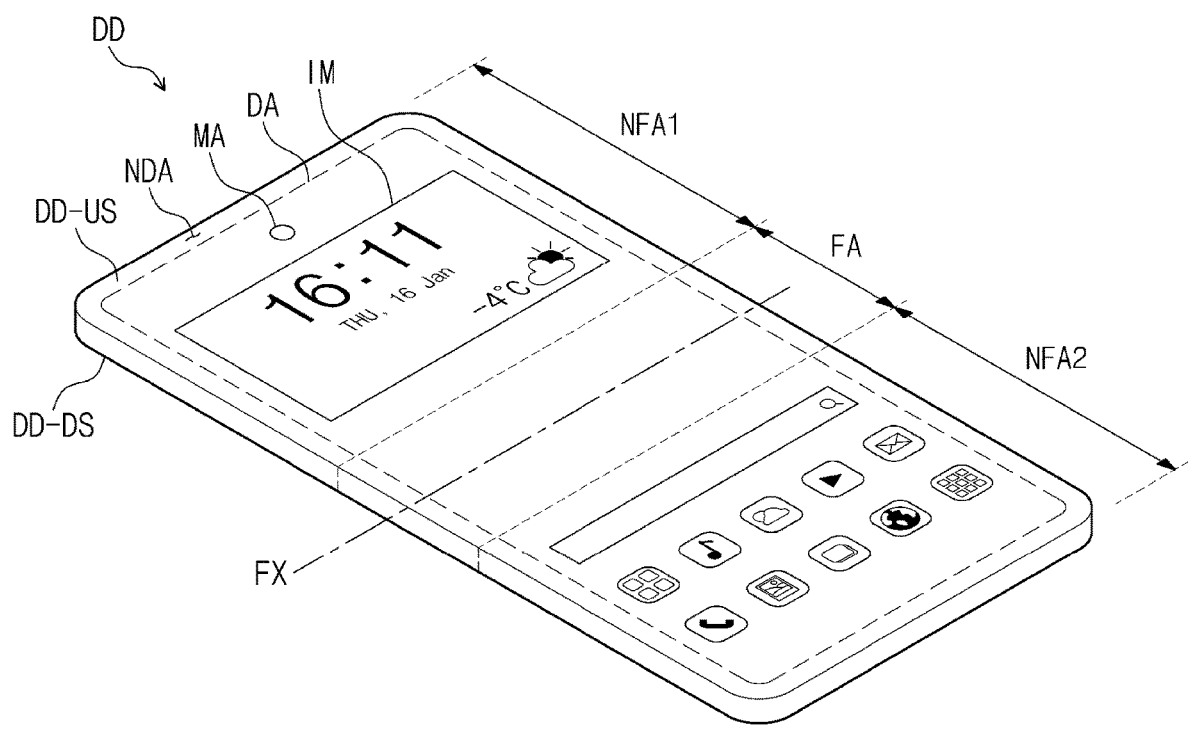
FIG. 1 is a schematic perspective view showing a display device according to an embodiment.

It will be understood that when an element (or an area, a layer, and a portion) or layer is referred to as being "on," "connected to," or "coupled to" another element or layer, it can be directly on, or connected or coupled to the other element or layer or intervening elements or layers may be present.

Like numerals refer to like elements throughout. In the drawings, the thickness, ratio, and dimension of components may be exaggerated for effective description of the technical content.

As used herein, the term "and/or" includes any and all combinations of one or more of the associated listed items. For example, "A and/or B" may be understood to mean "A, B, or A and B."

It will be understood that, although the terms first, second, and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and will not be interpreted in an ideal or excessively formal sense unless clearly defined herein.

It will be further understood that the terms "includes," "including," "comprise," and "comprising" when used in this specification, specify the presence of stated features, integers, steps, operations, elements, and/or components, but do not preclude the presence or addition of one or more other features, integers, steps, operations, elements, components, and/or groups thereof.

Hereinafter, the disclosure will be explained in detail with reference to the accompanying drawings.

Figure 2A:
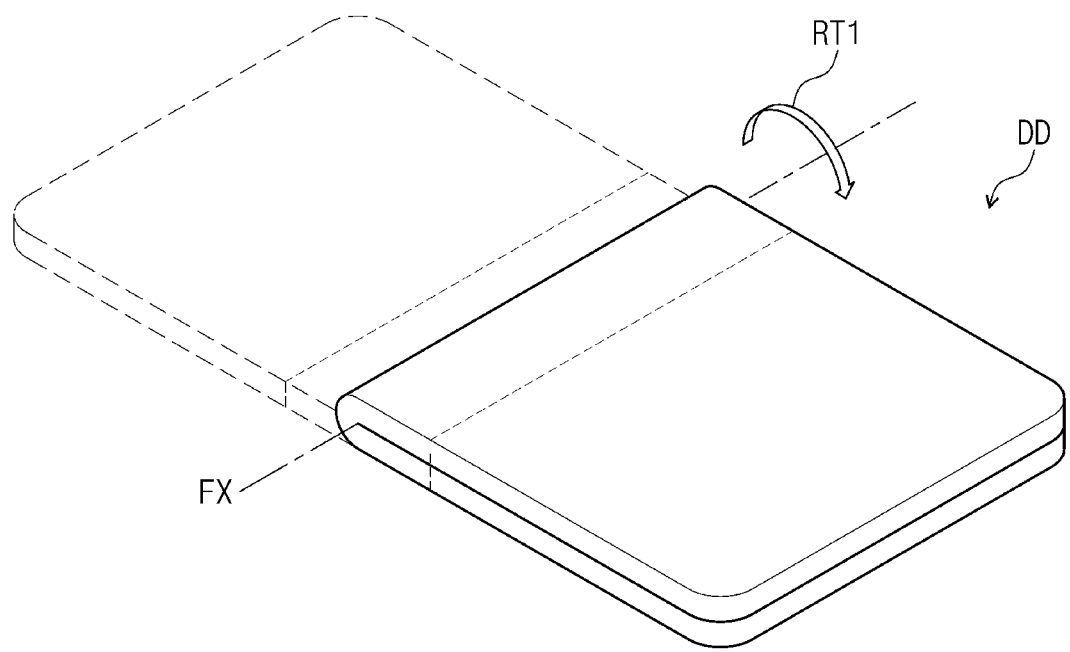
FIG. 2A is a schematic perspective view showing a display device folded about a folding axis according to an embodiment.
Figure 2B:
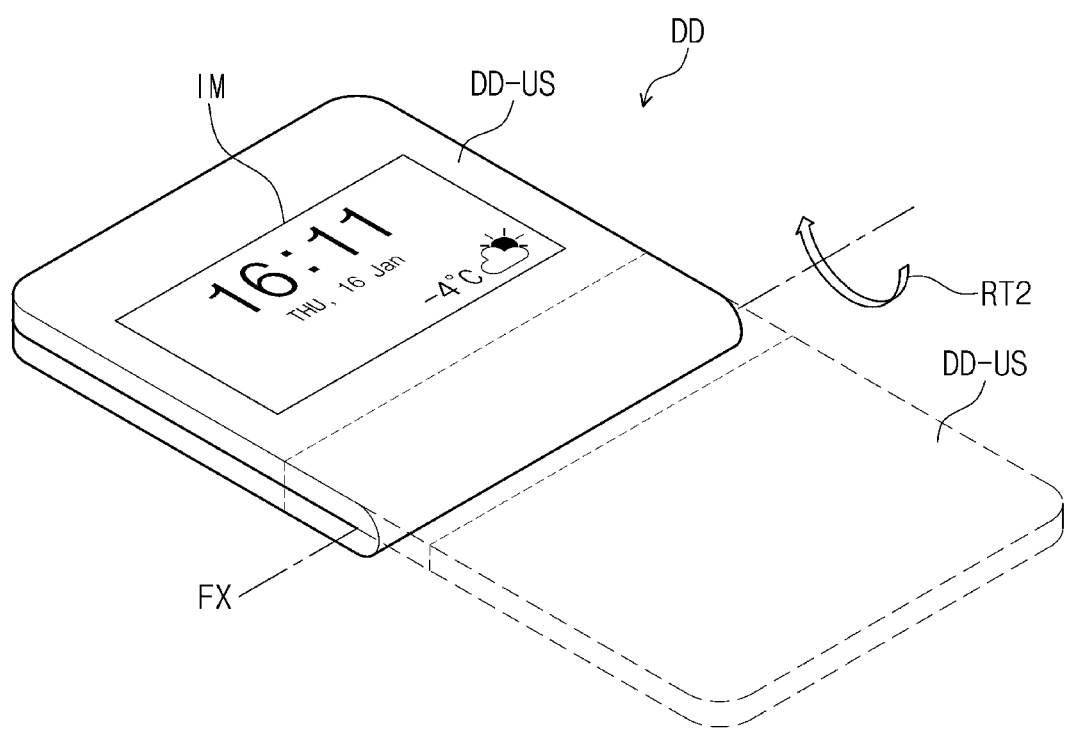
FIG. 2B is a schematic perspective view showing a display device folded about a folding axis according to an embodiment.

FIG. 1 is a schematic perspective view showing a display device DD according to an embodiment of the disclosure. FIG. 2A is a schematic perspective view showing the display device DD folded about a folding axis according to an embodiment of the disclosure. FIG. 2B is a schematic perspective view showing the display device DD folded about a folding axis according to an embodiment of the disclosure.

According to an embodiment of the disclosure, the display device DD that is foldable is shown as an example, however, the display device DD may be applied to various display devices, such as a curved display device, a bendable display device, a rollable display device, a stretchable display device, or the like. The display device DD may be applied to a large-sized electronic item, such as a television set, an outdoor billboard, etc., and a small and medium-sized electronic item, such as a mobile phone, a personal computer, a laptop computer, a personal digital assistant, a car navigation unit, a game console, a mobile electronic device, a wrist-type electronic device, a camera, etc.

Referring to FIG. 1, the display device DD includes areas distinguished from each other on a display surface. The display surface may include a display area DA in which an image IM is displayed and a peripheral area NDA in which the image IM is not displayed. The peripheral area NDA is defined adjacent to the display area DA. As an example, the display device DD shown in FIG. 1 is applied to a smartphone having a quadrangular shape and displays the image IM, such as weather information, icons, or the like. The peripheral area NDA may be defined adjacent to the display area DA, may surround the display area DA, or may be omitted.

The display surface is substantially parallel to a plane defined by a first direction DR1 and a second direction DR2. A third direction DR3 indicates a normal direction of the display surface, i.e., a thickness direction of the display device DD. In the following descriptions, the expression "when viewed in a plane," "on a plane," or "in a plan view" means viewing an object from above in the third direction DR3. Hereinafter, front (or upper) and rear (or lower) surfaces of each layer or each unit of the display device DD are distinct from each other by the third direction DR3. However, directions indicated by the first, second, and third directions DR1, DR2, and DR3 are relative to each other, and the directions indicated by the first, second, and third directions DR1, DR2, and DR3 may be changed to other directions, e.g., opposite directions.

According to the embodiment of the disclosure, the display device DD includes a folding area FA that is folded along a folding axis FX and first and second non-folding areas NFA1 and NFA2. The first non-folding area NFA1 and the second non-folding area NFA2 are spaced apart from each other in the second direction DR2 with the folding area FA interposed therebetween. The folding axis FX may extend in a direction substantially parallel to the first direction DR1.

An upper surface DD-US of the display device DD may include a first display surface overlapping the folding area FA, a second display surface overlapping the first non-folding area NFA1, and a third display surface overlapping the second non-folding area NFA2. A lower surface DD-DS of the display device DD may be opposite to the upper surface DD-US. The first to third display surfaces may display an image or respectively display different images from each other.

The display device DD may further include a module area MA surrounded by the display area DA. The module area MA may overlap at least one of the first non-folding area NFA1 and the second non-folding area NFA2. The module area MA may overlap an electronic module included in the display device DD. For example, the electronic module includes at least one of a camera, a speaker, a light sensor, and a heat sensor.

Referring to FIGS. 2A and 2B, the display device DD may be folded in opposite directions with respect to the folding axis FX.

Referring to FIG. 2A, the folding area FA is folded with respect to the folding axis FX such that the second display surface and the third display surface face each other. In this case, the folding area FA is folded according to a first rotation RT1, and the lower surface DD-DS is exposed to the outside.

Referring to FIG. 2B, the folding area FA is folded with respect to the folding axis FX such that the second display surface and the third display surface are exposed to the outside. In this case, the folding area FA is folded according to a second rotation RT2, and the upper surface DD-US is exposed to the outside.

As described above, the display device DD may be folded with respect to the folding axis FX such that the second display surface of the first non-folding area NFA1 faces the third display surface of the second non-folding area NFA2, and this folded state is referred to as an inner folding (or inner folding state). As another example, the display device DD may be folded with respect to the folding axis FX such that the second display surface of the first non-folding area NFA1 and the third display surface of the second non-folding area NFA2 are exposed to the outside, and this folded state is referred to as an outer folding (or outer folding state).

Figure 3:
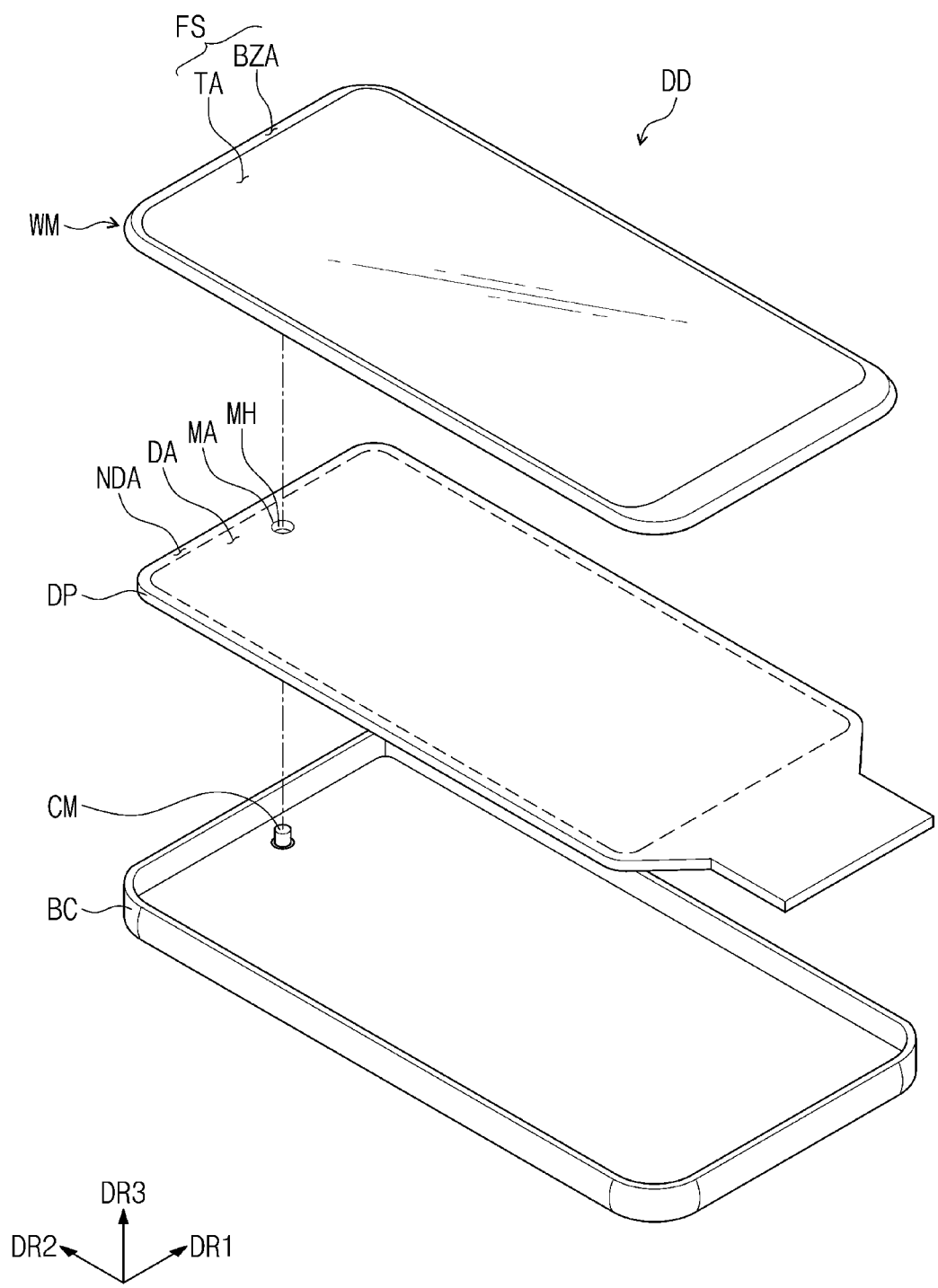
FIG. 3 is a schematic exploded perspective view showing a display device according to an embodiment.

FIG. 3 is a schematic exploded perspective view showing the display device DD according to an embodiment of the disclosure.

Referring to FIG. 3, the display device DD may include a window WM, a display panel DP, an electronic module CM, and a case BC. The window WM and the case BC are coupled to each other to define an exterior of the display device DD.

The window WM is disposed on the display panel DP and covers or overlaps a front surface of the display panel DP. The window WM may include an optically transparent insulating material. For example, the window WM includes a glass or plastic material. The window WM may have a single-layer structure or a multi-layer structure. As an example, the window WM has a stack structure of plastic films attached to each other by an adhesive or a stack structure of a glass substrate and a plastic film attached to the glass substrate by an adhesive.

The window WM includes a front surface FS exposed to the outside. The display surface of the display device DD may be substantially defined by the front surface FS of the window WM. The front surface FS may include a transmission area TA and a bezel area BZA.

In detail, the transmission area TA may be optically transparent. The transmission area TA may have a shape corresponding to that of the display area DA. For example, the transmission area TA overlaps all or at least a portion of the display area DA. The image IM displayed in the display area DA of the display panel DP may be viewed from the outside through the transmission area TA.

The bezel area BZA may have a relatively low light transmittance compared with the transmission area TA. The bezel area BZA defines the shape of the transmission area TA. The bezel area BZA may be adjacent to the transmission area TA and may surround the transmission area TA.

The bezel area BZA may have a predetermined color. In case that the window WM is a glass or plastic substrate, the bezel area BZA may include a color layer printed or deposited on a surface of the glass or plastic substrate. As another example, the bezel area BZA may be formed by coloring a corresponding area of the glass or plastic substrate.

The bezel area BZA covers or overlaps a peripheral area NDA of the display panel DP to prevent the peripheral area NDA from being viewed from the outside, however, this is merely an example. In another embodiment, the bezel area BZA may be omitted.

According to the disclosure, the front surface of the display panel DP includes a first area and a second area adjacent to the first area. The first area corresponds to the module area MA and the display area DA surrounding the module area MA, and the second area corresponds to the peripheral area NDA. The display area DA may be activated in response to electrical signals. The module area MA and the second area may be defined as a non-display area in which the image is not displayed.

A side portion of the peripheral area NDA of the display panel DP may have a bent shape. As a result, a portion of the peripheral area NDA may face a rear surface of the display panel DP, so that the bezel area BZA on the front surface of the window WM is reduced, however, the embodiments are not limited thereto. The display panel DP may be assembled in a flat state in which the display area DA and the peripheral area NDA face the window WM.

The module area MA may have a relatively higher transmittance in the same area than the display area DA. The module area MA is defined at a position overlapping the electronic module CM in a plan view, which is described below.

At least a portion of the module area MA may be surrounded by the display area DA. In the embodiment, the module area MA is spaced apart from the peripheral area NDA. The module area MA is defined in the display area DA such that an entire edge of the module area MA is surrounded by the display area DA.

The display panel DP may include a module hole MH defined through the display panel DP in the module area MA. The module hole MH may penetrate through the display panel DP. The edge of the module area MA may be substantially spaced apart from an edge of the module hole MH by a predetermined distance and may extend along the edge of the module hole MH. The edge of the module area MA may have a shape corresponding to the module hole MH.

The electronic module CM is disposed under the window WM. The electronic module CM may overlap the module hole MH defined in the module area MA. The electronic module CM receives the external input transmitted through the module area MA or provides an output through the module area MA.

Among components of the electronic module CM, a receiving unit receiving the external input or an outputting unit providing the output may overlap the module area MA in a plan view. All or a portion of the electronic module CM may be accommodated in the module area MA or the module hole MH. According to the disclosure, as the electronic module CM is disposed to overlap the display area DA, the size of the bezel area BZA may be reduced.

Although not shown in figures, the display device DD may further include an input sensing layer disposed between the display panel DP and the window WM and sensing an external input. The external input may include various forms, such as a part of a user's body, a stylus pen, light, heat, or pressure. Also, in addition to an input by a contact of a part of a user's body, such as a user's hand, the external input may include a proximity or approaching of an object (e.g., a hovering of an object). In case that the display device DD further includes the input sensing layer, the module hole MH may penetrate through the display panel DP and the input sensing layer, which overlap the module area MA.

Figure 4:
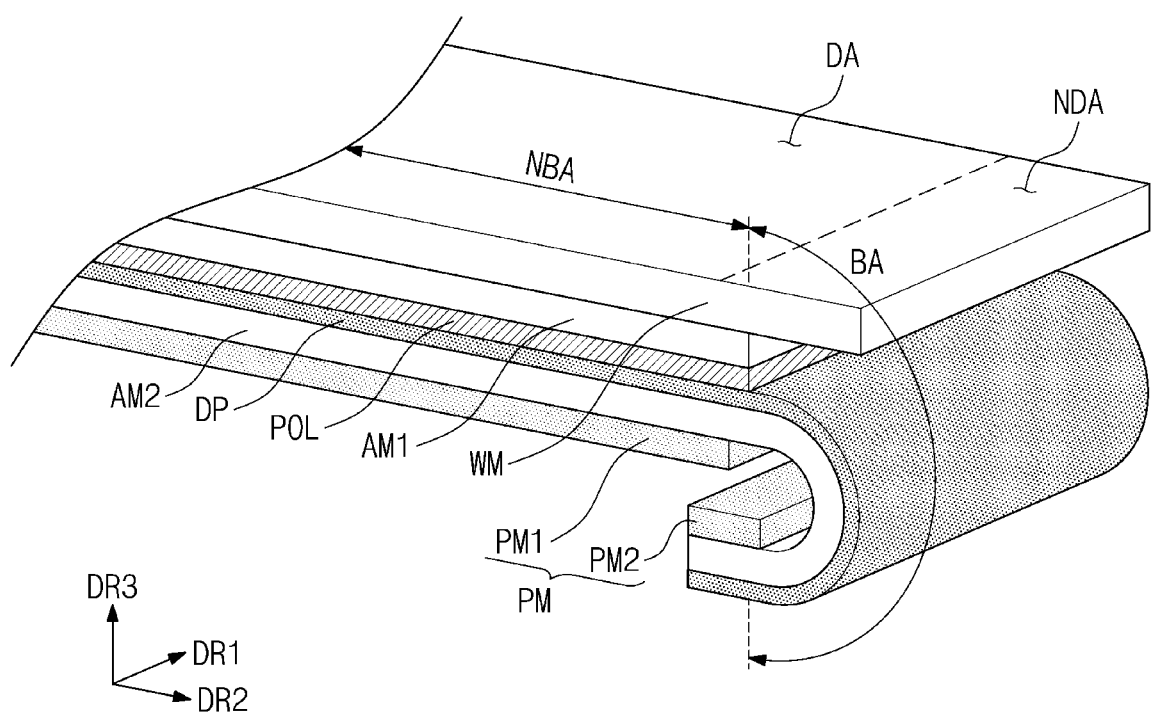
FIG. 4 is a schematic cross-sectional view showing a display device according to an embodiment.

FIG. 4 is a schematic cross-sectional view showing the display device according to an embodiment.

Referring to FIG. 4, the display device DD may further include a first adhesive layer AM1, an external light reflection member POL, a second adhesive layer AM2, and a support layer PM.

The display panel DP may include a non-bending portion NBA and a bending portion BA bent from a side of the non-bending portion NBA. The first non-folding area NFA1, the second non-folding area NFA2, and the folding area FA of the display device DD described with reference to FIG. 1 may correspond to the non-bending portion NBA of the display panel DP. The non-bending portion NBA of the display panel DP may indicate a flat portion and may correspond to the display area DA and at least a portion of the peripheral area NDA of the display device DD shown in FIG. 1.

The bending portion BA may correspond to the peripheral area NDA and may be bent from the side of the non-bending portion NBA in the second direction DR2. In particular, at least a portion of the bending portion BA overlaps the non-bending portion NBA in the third direction DR3. As shown in FIG. 4, the peripheral area NDA of the front surface of the display device DD is reduced because of the bending portion BA of the display panel DP.

Although not shown in figures, an external circuit board may be electrically connected to an end of the bending portion BA. The external circuit board may apply driving signals to drive the display panel DP to pixels of the display panel DP through the bending portion BA.

The first adhesive layer AM1 may overlap the non-bending portion NBA of the display panel DP and may be disposed between the window WM and the external light reflection member POL. The first adhesive layer AM1 may be one of an optically clear adhesive film (OCA), an optically clear resin (OCR), and a pressure sensitive adhesive film (PSA).

The external light reflection member POL may overlap the non-bending portion NBA of the display panel DP and may be disposed between the first adhesive layer AM1 and the display panel DP. As an example, the external light reflection member POL may be a polarizing layer, and a polarization of the external light incident through the window WM may be controlled by the external light reflection member POL. As another example, the external light reflection member POL may include a color filter that absorbs the external light. Although not shown in figures, an adhesive layer may be additionally disposed between the external light reflection member POL and the display panel DP.

The second adhesive layer AM2 may be disposed under the display panel DP. For example, the second adhesive layer AM2 entirely overlaps the bending portion BA and the non-bending portion NBA of the display panel DP. For example, the second adhesive layer AM2 includes a first adhesive portion overlapping the non-bending portion NBA and a second adhesive portion overlapping the bending portion BA. As another example, the second adhesive layer AM2 includes a first adhesive portion overlapping the non-bending portion NBA and a second adhesive portion overlapping a portion of the bending portion BA. In this case, the first adhesive portion and the second adhesive portion may be spaced apart from each other.

The second adhesive layer AM2 may include one of an optically clear adhesive film (OCA), an optically clear resin (OCR), and a pressure sensitive adhesive film (PSA).

The support layer PM is disposed under the second adhesive layer AM2. The support layer PM is attached to the display panel DP by the second adhesive layer AM2 to be disposed under the display panel DP. The support layer PM may include a main supporter PM1 overlapping the non-bending portion NBA of the display panel DP and an auxiliary supporter PM2 overlapping the bending portion BA of the display panel DP.

According to the disclosure, the support layer PM may be disposed under the display panel DP to prevent the display panel DP from being damaged and to prevent a crease from occurring in the folding area FA of the display device DD shown in FIG. 1 because of the folding operation.

The support layer PM may include different materials. For instance, a portion overlapping the folding area FA of the display device DD and a portion overlapping the non-folding areas NFA1 and NFA2 of the display device DD include different materials from each other. For example, a material of the main supporter PM1 overlapping the folding area FA and a material of the main supporter PM1 overlapping the non-folding areas NFA1 and NFA2 may be different from each other to prevent the crease from occurring in the folding area FA of the display device DD because of the repetitive folding operation. This will be described in detail with reference to FIG. 5.

Figure 5:
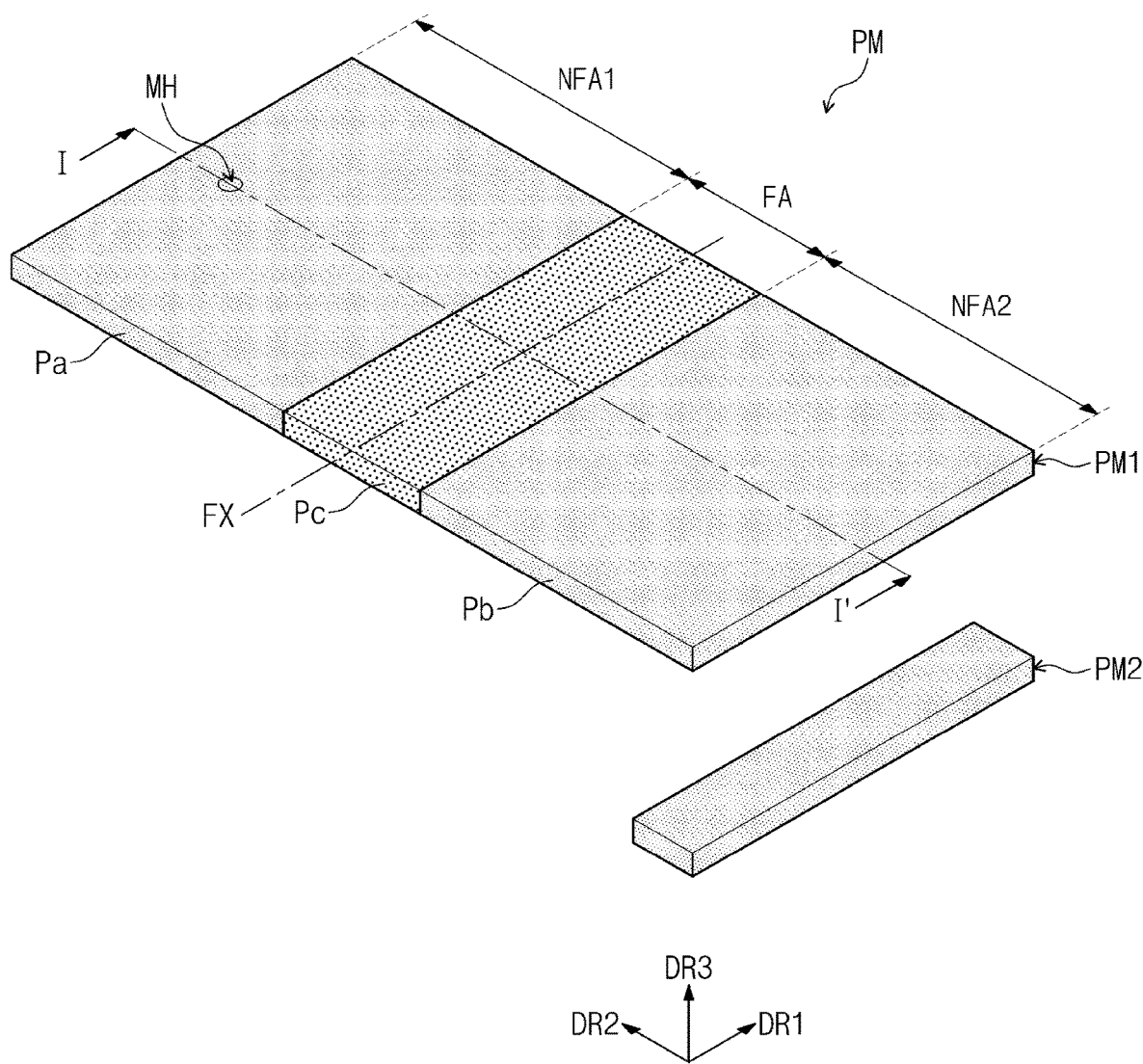
FIG. 5 is a schematic perspective view showing a support layer according to an embodiment.
Figure 6:
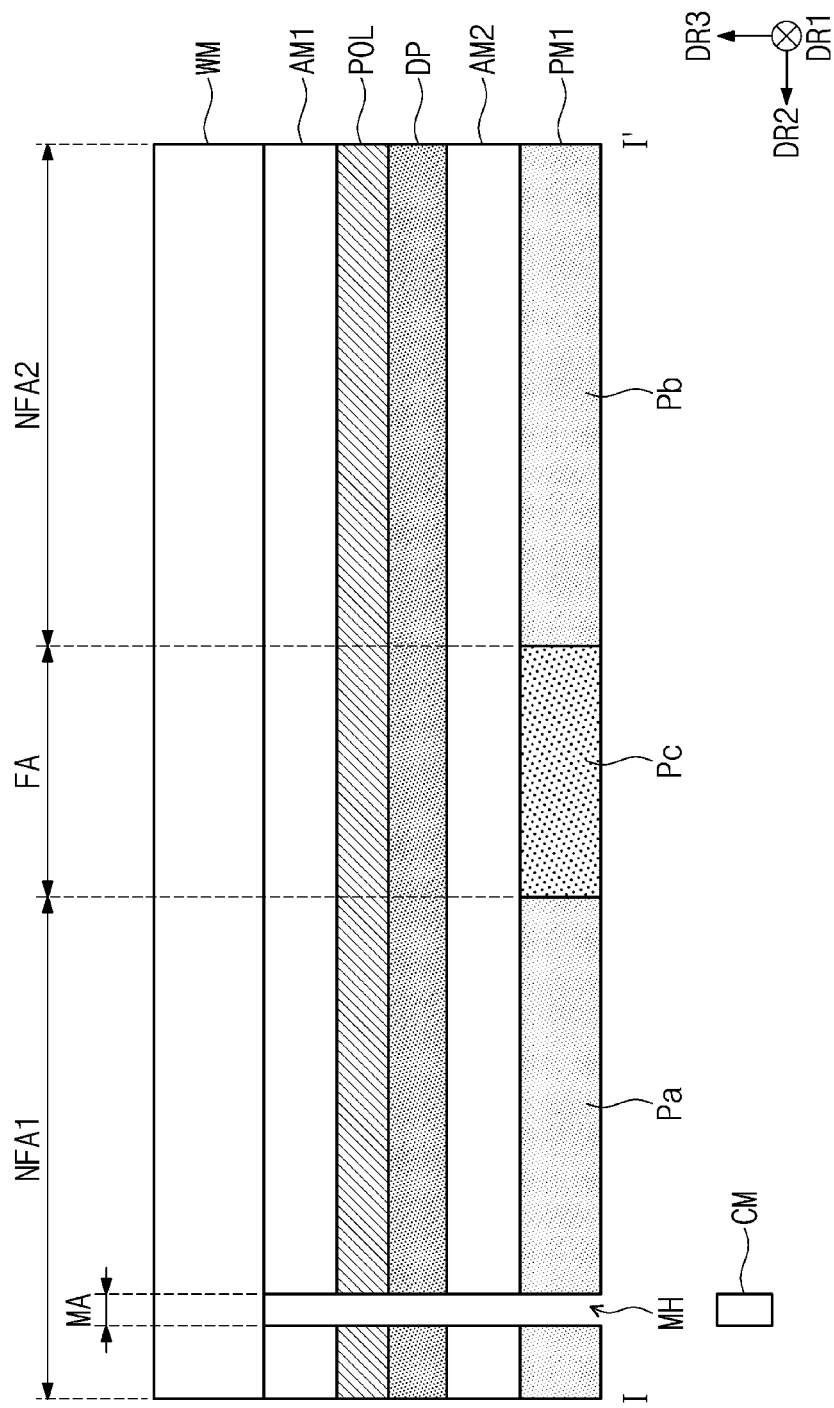
FIG. 6 is a schematic cross-sectional view taken along line I-I' shown in FIG. 5 according to an embodiment.

FIG. 5 is a schematic perspective view showing the support layer PM according to an embodiment, and FIG. 6 is a schematic cross-sectional view taken along line I-I' shown in FIG. 5 according to an embodiment.

Referring to FIG. 5, the main supporter PM1 includes first supporters Pa and Pb and a second supporter Pc. The first supporters Pa and Pb may include a first support portion Pa and a second support portion Pb, and the second supporter Pc may be disposed between the first support portion Pa and the second support portion Pb.

The first support portion Pa overlaps the first non-folding area NFA1 and is disposed under the display panel DP, and the second support portion Pb overlaps the second non-folding area NFA2 and is disposed under the display panel DP. The first support portion Pa and the second support portion Pb may be spaced apart from each other in the second direction DR2.

The module hole MH (refer to FIG. 3) is formed in at least one of the first support portion Pa and the second support portion Pb. In an embodiment, the module hole MH is formed through the first support portion Pa.

As shown in FIG. 6, the module hole MH may penetrate the first support portion Pa, the second adhesive layer AM2, the display panel DP, the external light reflection member POL, and the first adhesive layer AM1. The module hole MH may be formed using a laser beam provided from the outside. The module hole MH may be formed in components of the display device DD but not in the window WM through which an image is viewed from the outside. The electronic module CM may be disposed under the first support portion Pa to overlap the module hole MH. The electronic module CM may be a camera module and may receive or emit the light through the module hole MH.

According to the disclosure, the first support portion Pa, the second support portion Pb, and the second supporter Pc may have substantially the same thickness in the third direction DR3 and may be attached to the second adhesive layer AM2. For example, the first supporters Pa and Pb and the second supporter Pc include different materials from each other, the first supporters Pa and Pb and the second supporter Pc may have the same thickness. In the disclosure, the term "the same thickness" as used herein may mean a substantially identical thickness with process tolerances.

Referring to FIG. 5, the first support portion Pa and the second support portion Pb may include substantially the same material. The first support portion Pa and the second support portion Pb may include a polymer resin, e.g., polyethylene terephthalate (PET). The polyethylene terephthalate (PET) material is a material through which a laser beam may penetrate, and the module hole MH may be formed in the first support portion Pa by the laser beam.

However, the materials of the first support portion Pa and the second support portion Pb are not limited thereto, and the first support portion Pa and the second support portion Pb may include various materials. For example, the first support portion Pa and the second support portion Pb may include a polymer film such as polyimide.

The second supporter Pc overlaps the folding area FA and may be disposed under the display panel DP. The second supporter Pc may include a material that prevents the crease from occurring in the folding area FA of the display device DD. For instance, the second supporter Pc may include a glass material. The second supporter Pc including the glass material may effectively prevent the crease from occurring in the folding area FA of the display device DD when compared with the first supporters Pa and Pb including polyethylene terephthalate (PET). In this case, the crease of the display device DD caused by the repetitive folding operation may be viewed from the window WM (refer to FIG. 3) around the folding axis FX.

The second supporter Pc has a thickness equal to or greater than about 25 micrometers and equal to or smaller than about 75 micrometers in the third direction DR3. As the second supporter Pc has the thickness in the above-mentioned range, a folding characteristic of the second supporter Pc overlapping the folding area FA may be improved.

According to an embodiment, each of the first support portion Pa and the second support portion Pb may have an area greater than that of the second supporter Pc in a plan view. In this case, the module hole MH may be surrounded by the first support portion Pa in a plan view.

In case that the second supporter Pc including the glass material forms (or constitutes) the whole main supporter PM1, it may be difficult to form the module hole MH in the first support portion Pa. This is because the laser beam provided from the outside to form the mole hole MH may be reflected by the glass material.

Thus, the first support portion Pa and the second support portion Pb according to the disclosure may include polyethylene terephthalate (PET) through which the laser beam easily penetrates, and the second supporter Pc may include the glass material to prevent the crease from occurring in the display device DD.

As described above, the main supporter PM1 according to the disclosure may include the material through which the module hole MH is easily formed and the material appropriate to prevent the crease from occurring because of the folding operation. Accordingly, the crease occurrence in the folding area FA of the display device DD may be prevented overall, and a process efficiency in forming the module hole MH may be improved.

The auxiliary supporter PM2 and the first supporters Pa and Pb may include the same material such as polyethylene terephthalate (PET). In another example, the auxiliary supporter PM2 and the first supporters Pa and Pb or the second supporter Pc may include the same material.

Figure 7A:
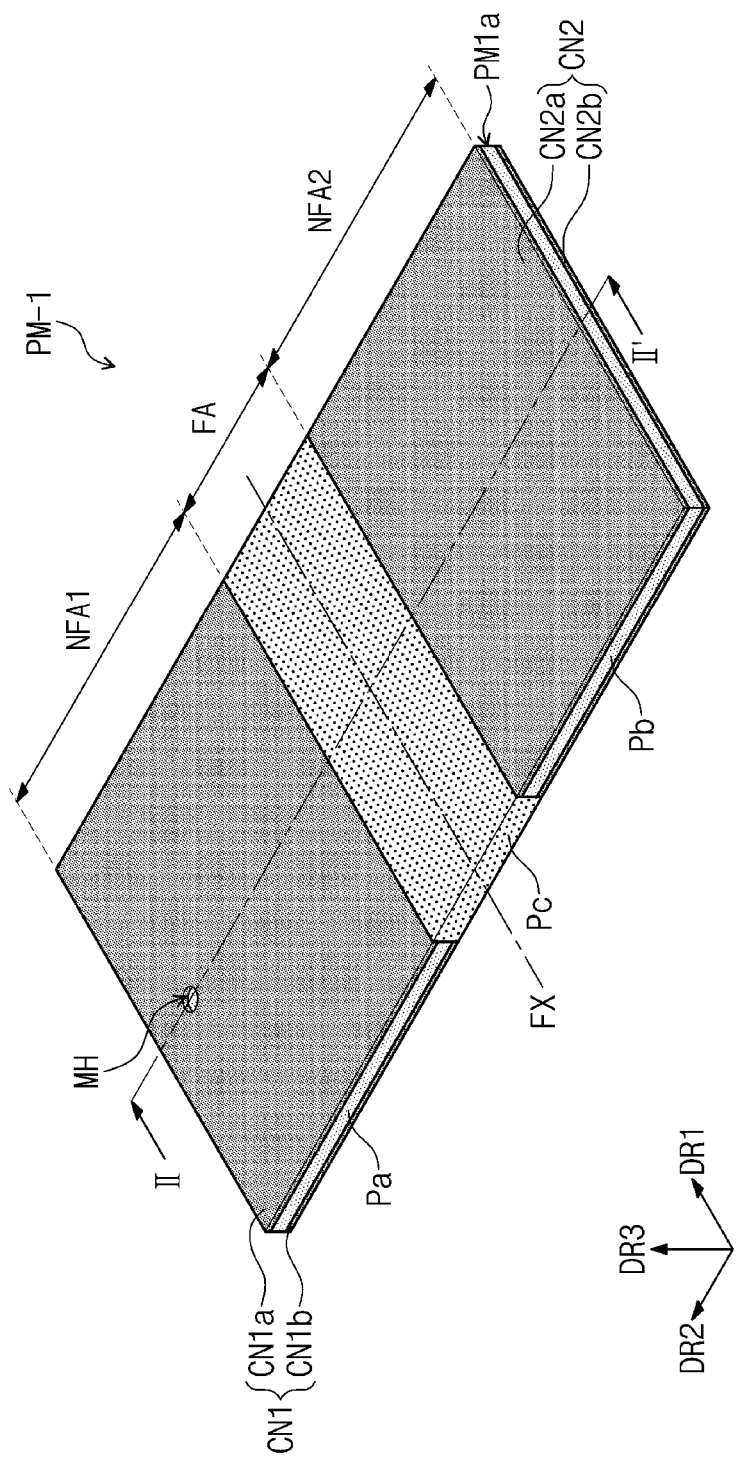
FIG. 7A is a schematic perspective view showing a support layer according another embodiment.
Figure 7B:
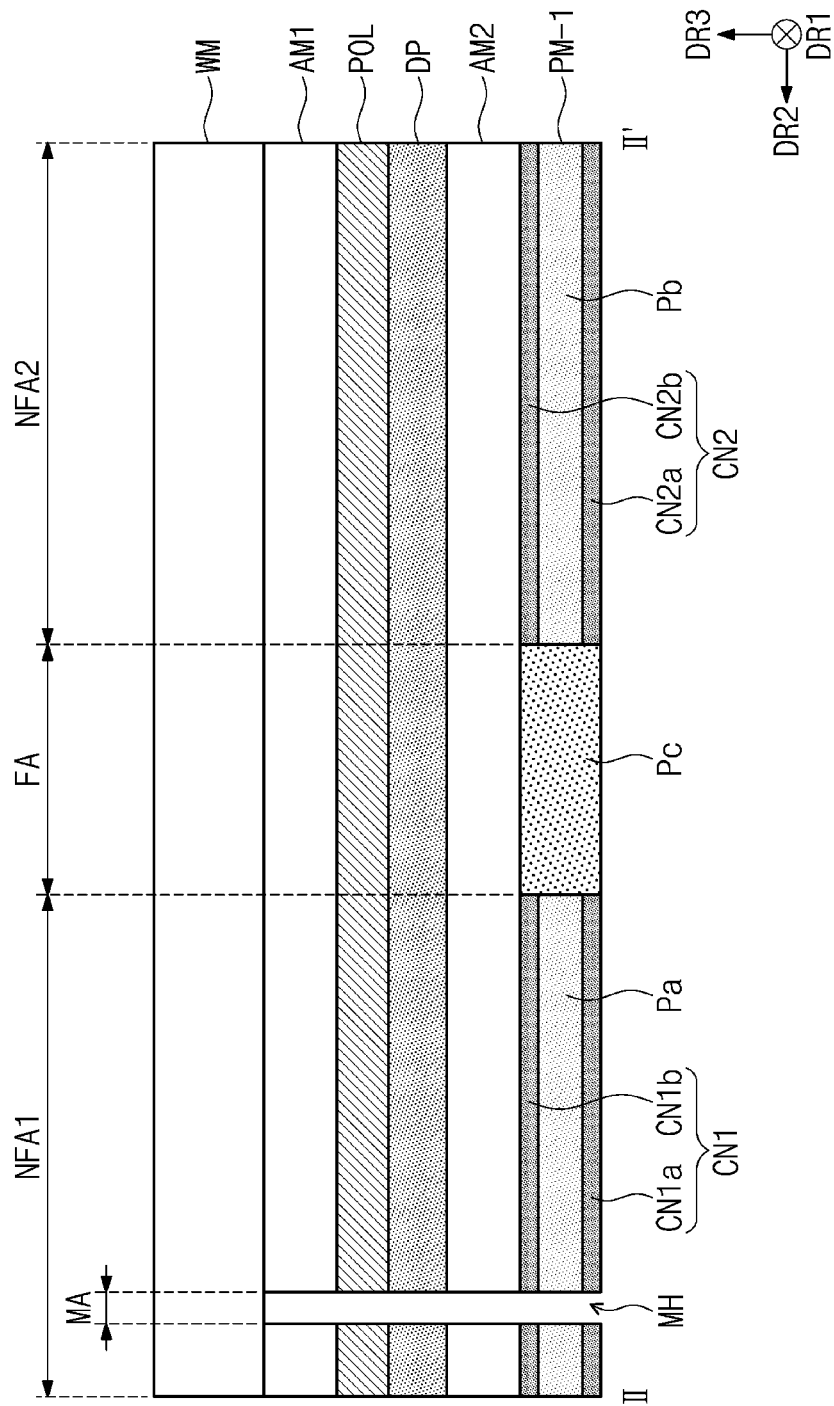
FIG. 7B is a schematic cross-sectional view taken along line II-II' shown in FIG. 7A according to an embodiment.

FIG. 7A is a schematic perspective view showing a support layer PM-1 according to another embodiment, and FIG. 7B is a schematic cross-sectional view taken along line II-II' shown in FIG. 7A according to an embodiment.

The main supporter PM1a shown in FIGS. 7A and 7B and the main supporter PM1 shown in FIG. 5 has substantially the same structure except for antistatic layers CN1 and CN2 added to the main supporter PM1a.

Referring to FIGS. 7A and 7B, the antistatic layers CN1 and CN2 include a first coating part CN1 and a second coating part CN2. The first coating part CN1 may overlap a first non-folding area NFA1, and the second coating part CN2 may overlap a second non-folding area NFA2. The antistatic layers CN1 and CN2 may not overlap a folding area FA.

According to the disclosure, the antistatic layers CN1 and CN2 may be easily formed on first supporters Pa and Pb that include a material different from that of a second supporter Pc.

In an embodiment, the first coating part CN1 includes a first coating portion CN1a disposed on an upper surface of a first support portion Pa and a second coating portion CN1b disposed on a lower surface of the first support portion Pa. The first coating portion CN1a, the second coating portion CN1b, and the first support portion Pa may have the same area in a plan view. The first coating portion CN1a and the second coating portion CN1b may have a thickness smaller than that of the first support portion Pa. As an example, a sum of the thickness of the first coating portion CN1a and the thickness of the second coating portion CN1b may be smaller than the thickness of the first support portion Pa.

In an embodiment, the second coating part CN2 includes a third coating portion CN2a disposed on an upper surface of a second support portion Pb and a fourth coating portion CN2b disposed on a lower surface of the second support portion Pb. The third coating portion CN2a, the fourth coating portion CN2b, and the second support portion Pb may have the same area in a plan view. The third coating portion CN2a and the fourth coating portion CN2b may have a thickness smaller than that of the second support portion Pb. For example, a sum of the thickness of the third coating portion CN2a and the thickness of the fourth coating portion CN2b may be smaller than the thickness of the second support portion Pb.

A sum of the thickness of the first coating part CN1 and the thickness of the first support portion Pa may be substantially equal to the thickness of the second supporter Pc. Similarly, a sum of the thickness of the second coating part CN2 and the thickness of the second support portion Pb may be substantially equal to the thickness of the second supporter Pc.

According to the disclosure, the antistatic layers CN1 and CN2 may include an organic or inorganic conductive material, such as a conductive polymer, a silver nano-particle, a graphene, a carbon nanotube, or the like. The antistatic layers CN1 and CN2 may be formed by coating a paste obtained by mixing a conductive material with a matrix and then curing the paste. As the matrix, organic or inorganic matrix, such as tetra-ethyl-ortho-silicate, polysilane, and polysilazane, and various non-conductive curing polymers may be used.

The antistatic layers CN1 and CN2 may be formed by coating and curing a conductive coating solution composition. However, the method of forming the antistatic layers CN1 and CN2 is not limited thereto. As the coating method, well-known methods, such as a slit coating method, a knife coating method, a spin coating method, a casting method, a micro gravure coating method, a gravure coating method, a bar coating method, a roll coating method, a wire bar coating method, a dip coating method, a spray coating method, a screen printing method, a gravure printing method, a flexo printing method, an offset printing method, an inkjet coating method, a dispenser printing method, a nozzle coating method, and a capillary coating method, may be used. The antistatic layers CN1 and CN2 may be formed by curing the coating layer by a dry process at a predetermined temperature after the coating process.

Figure 8A:
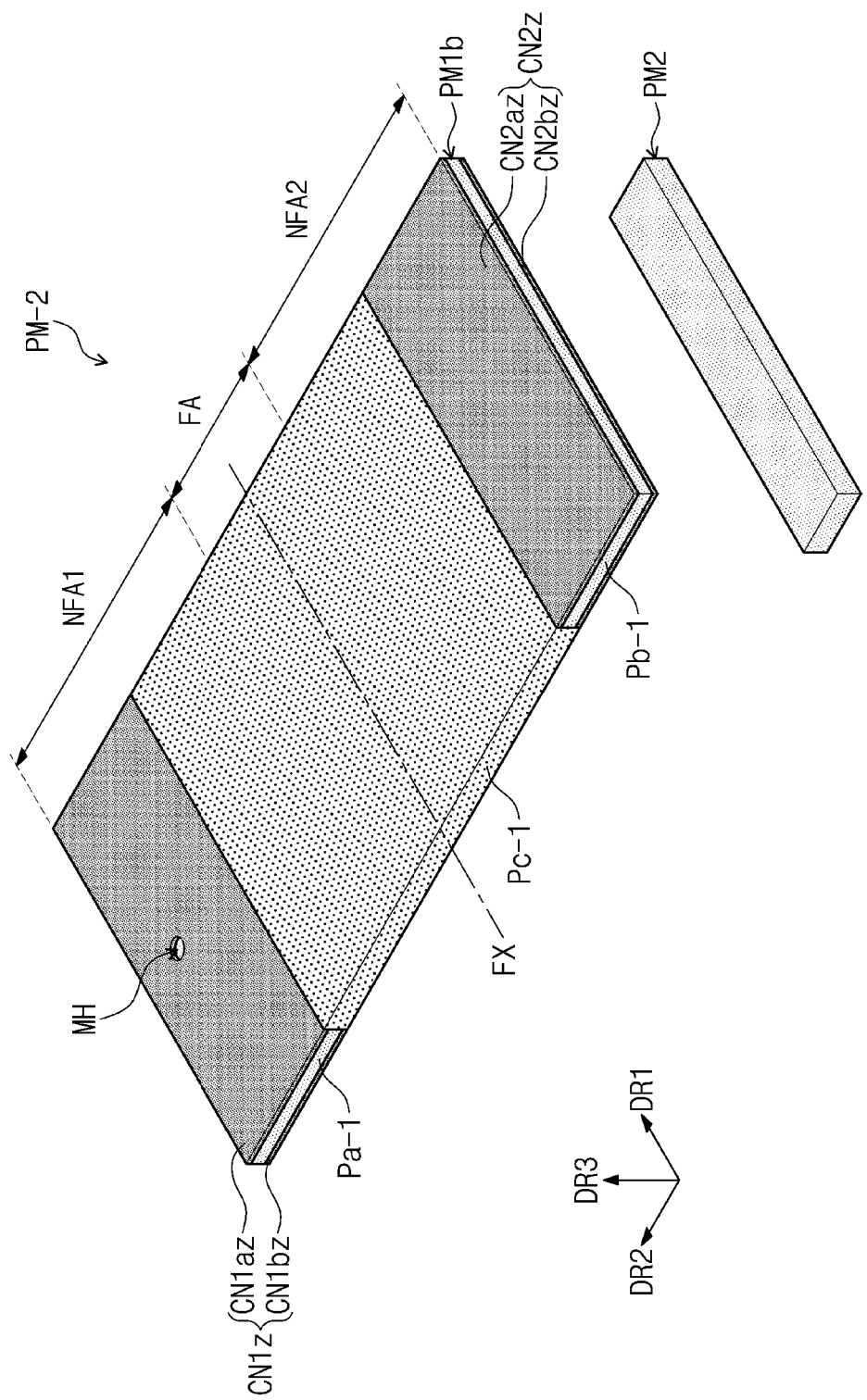
FIGS. 8A and 8B are schematic perspective views showing a support layer according to another embodiment.
Figure 8B:
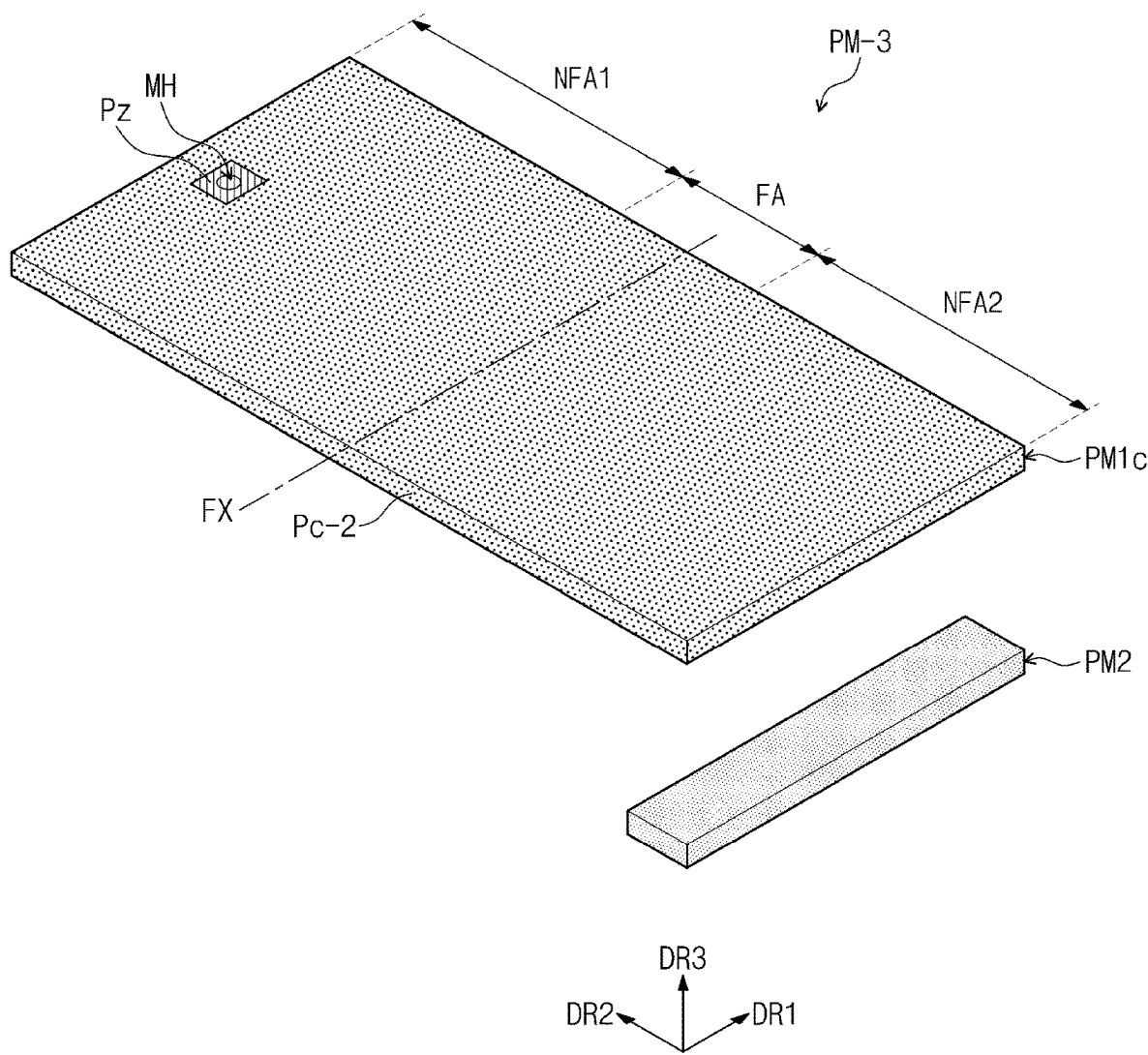

FIGS. 8A and 8B are schematic perspective views showing support layers PM-2 and PM-3 according to another embodiment.

The support layers PM-2 and PM-3 shown in FIGS. 8A and 8B and the support layer PM shown in FIG. 5 may have substantially the same structure except for main supporters PM1b and PM1c and antistatic layers CN1z and CN2z. Hereinafter, the main supporters PM1b and PM1c will be mainly described.

Referring to FIG. 8A, the main supporter PM1b of the support layer PM-2 includes first supporters Pa-1 and Pb-1 and a second supporter Pc-1. According to the disclosure, the first supporters Pa-1 and Pb-1 have an area smaller than that of the second supporter Pc-1 in a plan view. For example, a sum of an area of a first support portion Pa-1 and an area of a second support portion Pb-1 is smaller than the area of the second supporter Pc-1 in a plan view.

In an embodiment, a first coating part CN1z includes a first coating portion CN1az disposed on an upper surface of the first support portion Pa-1 and a second coating portion CN1bz disposed on a lower surface of the first support portion Pa-1. A second coating part CN2z includes a third coating portion CN2az disposed on an upper surface of the second support portion Pb-1 and a fourth coating portion CN2bz disposed on a lower surface of the second support portion Pb-1.

The second supporter Pc-1 is disposed between the first support portion Pa-1 and the second support portion Pb-1 and may overlap a first non-folding area NFA1 and a second non-folding area NFA2 in addition to a folding area FA. For example, the first support portion Pa-1 overlaps a portion of the first non-folding area NFA1, and a portion of the second supporter Pc-1 overlaps the other portion of the first non-folding area NFA1. The second support portion Pb-1 overlaps a portion of the second non-folding area NFA2, and another portion of the second supporter Pc-1 overlaps the other portion of the second non-folding area NFA2. The other portion of the second supporter Pc-1 overlaps the folding area FA.

Referring to FIG. 8B, a main supporter PM1c of the support layer PM-3 includes a first supporter Pz and a second supporter Pc-2. The first supporter Pz may surround a module hole MH in a plan view and may be disposed under a display panel DP overlapping a first non-folding area NFA1. According to the disclosure, the second supporter Pc-2 surrounds the first supporter Pz in a plan view and overlaps the first non-folding area NFA1, a second non-folding area NFA2, and a folding area FA.

The first supporter Pz may include a material through which a hole may be formed using a laser beam provided from the outside. For example, the first supporter Pz may include polyethylene terephthalate (PET) to form the module hole MH, and an area of the first supporter Pz may be provided as a minimum area for the module hole MH to be formed.

Figure 9A:
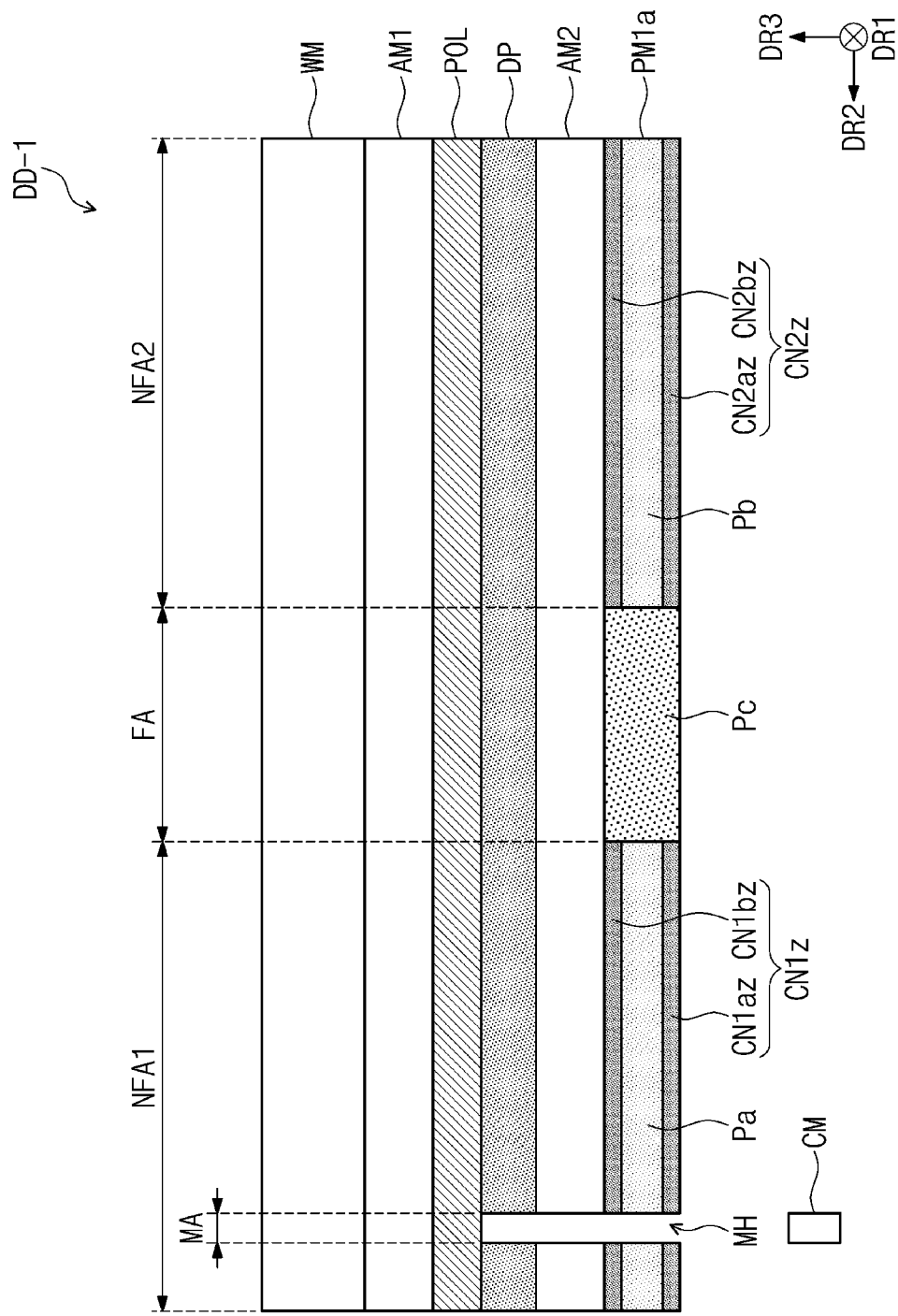
FIGS. 9A and 9B are schematic cross-sectional views showing display devices according to another embodiment.
Figure 9B:
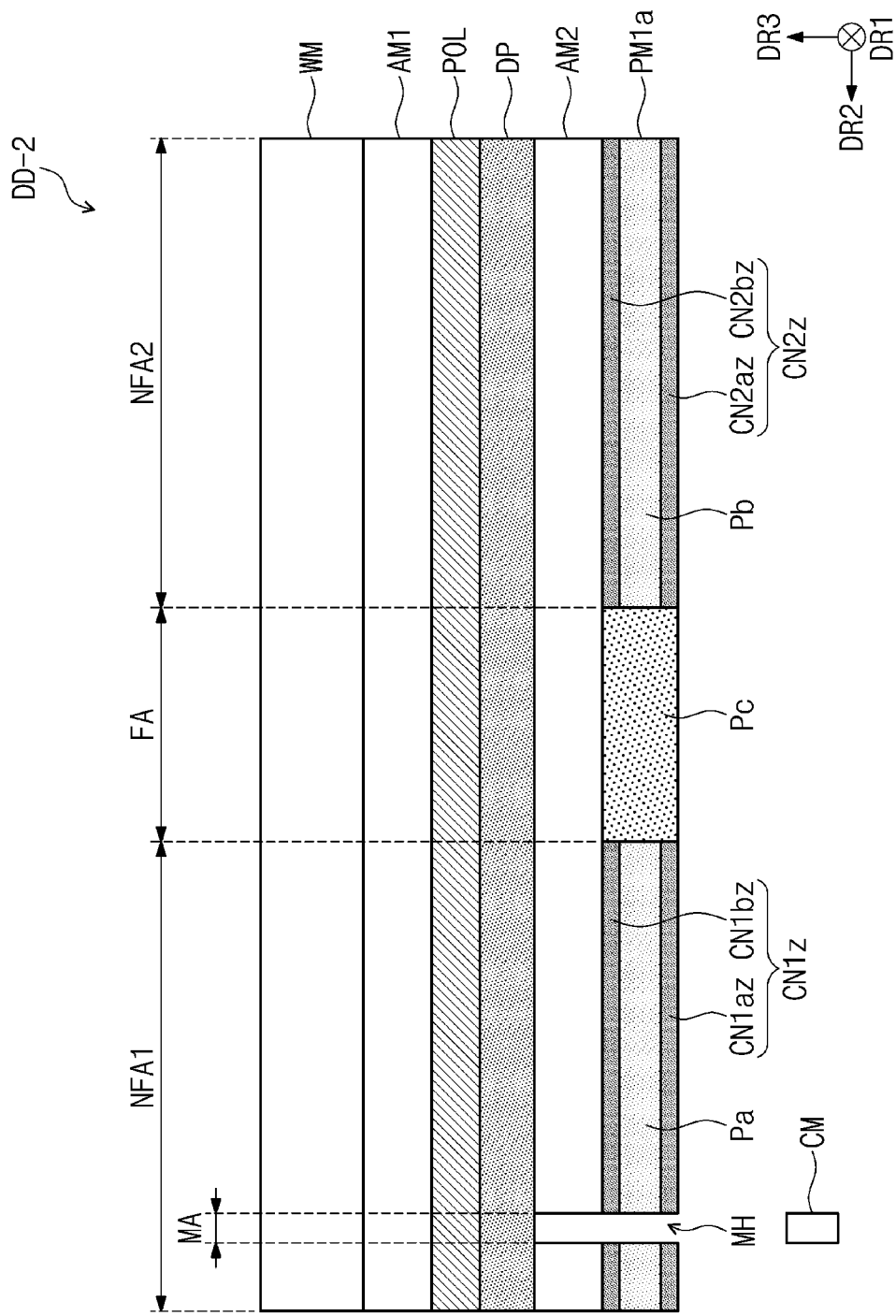

FIGS. 9A and 9B are schematic cross-sectional views showing display devices DD-1 and DD-2 according to another embodiment.

The display devices DD-1 and DD-2 shown in FIGS. 9A and 9B and the display device DD shown in FIG. 6 may have substantially the same structure except for a structure of a module hole MH formed by using an external laser beam. Additionally, the display devices DD-1 and DD-2 shown in FIGS. 9A and 9B may further include the antistatic layers CN1 and CN2 shown in FIG. 7A. However, the embodiments are not limited thereto. For example, unlike the embodiments shown in FIGS. 9A and 9B, the antistatic layers CN1 and CN2 may be omitted.

Referring to FIG. 9A, a module hole MH corresponding to a module area MA may be defined by an opening formed in a main supporter PM1*a* of the support layer PM-1 (see, e.g., FIG. 7A), a second adhesive layer AM2, and a display panel DP. For example, the external laser beam penetrates through the main supporter PM1*a*, the second adhesive layer AM2, and the display panel DP, to form the module hole MH.

Referring to FIG. 9B, a module hole MH corresponding to a module area MA is defined by an opening formed in a main supporter PM1*a* of the support layer PM-1 and a second adhesive layer AM2. For example, the external laser beam penetrates through the main supporter PM1*a* and the second adhesive layer AM2, to form the module hole MH.

In this case, an arrangement of pixels of the display panel DP overlapping the module area MA is different from an arrangement of pixels of the display panel DP not overlapping the module area MA. In the same area, the number of the pixels overlapping the module area MA is smaller than the number of the pixels not overlapping the module area MA. As an example, in case that the number of the pixels overlapping the module area MA in an area is eight (8), the number of the pixels not overlapping the module area MA may be sixteen (16) in the same area.

FIGS. 10A to 10D are views showing a method of manufacturing a display device according to an embodiment.

Figure 10A:
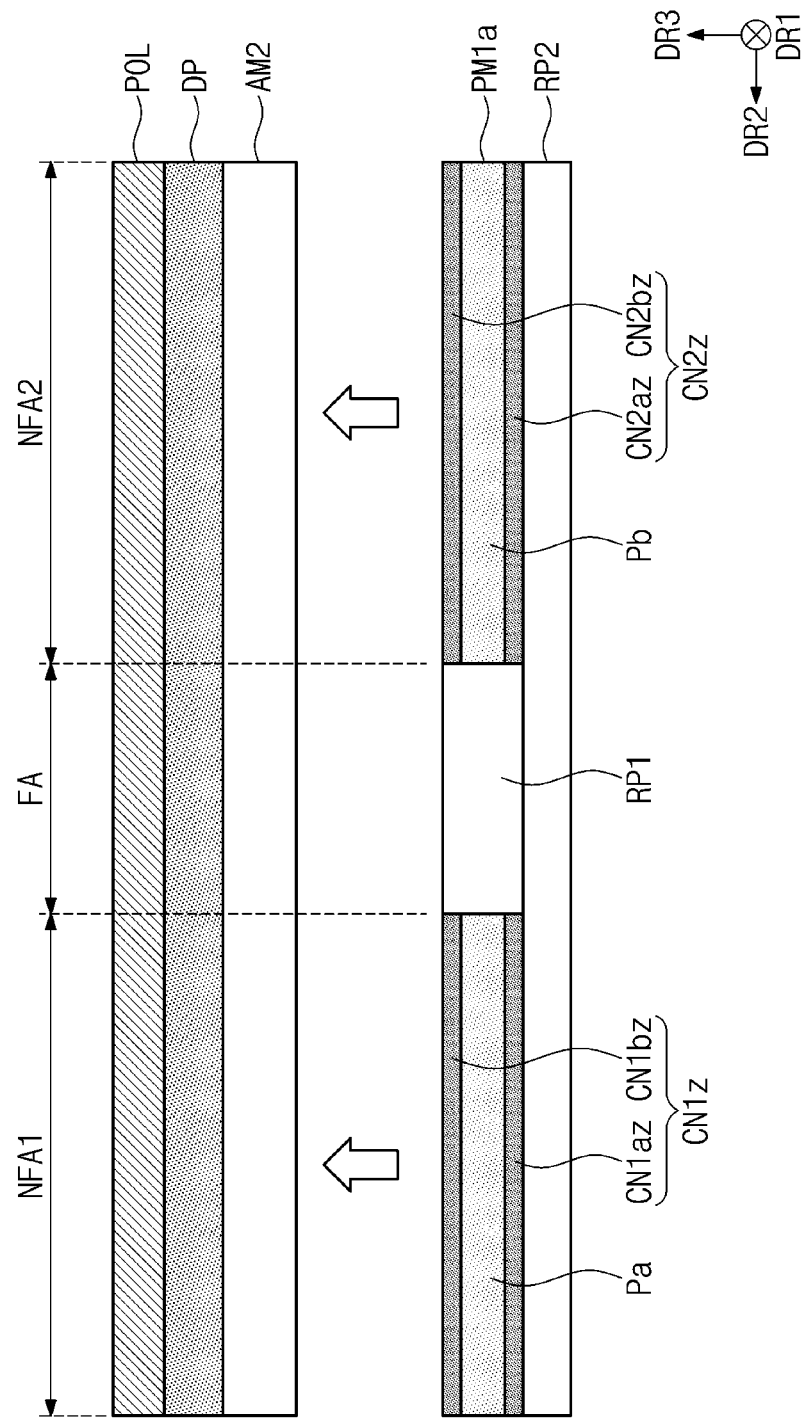
FIGS. 10A to 10D are views showing a method of manufacturing a display device according to an embodiment.

Referring to FIG. 10A, a support layer PM-1 is disposed under a display panel DP. As an example, the support layer PM-1 shown in FIGS. 10A to 10D may correspond to the support layer PM-1 shown in FIG. 7A. However, the embodiments are not limited thereto. For example, the antistatic layers CN1 and CN2 may be omitted.

The support layer PM-1 includes a first support portion Pa overlapping a first non-folding area NFA1 and a second support portion Pb overlapping a second non-folding area NFA2. Each of the first support portion Pa and the second support portion Pb includes a first material. The support layer PM-1 includes a first coating part CN1*z* that includes a first coating portion CN1*az* and a second coating portion CN1*bz* and a second coating part CN2*z* that includes a third coating portion CN2*az* and a fourth coating portion CN2*bz*.

In this case, a first release paper RP1 is disposed between the first support portion Pa and the second support portion Pb, and a second release paper RP2 is disposed under the support layer PM-1.

Figure 10B:
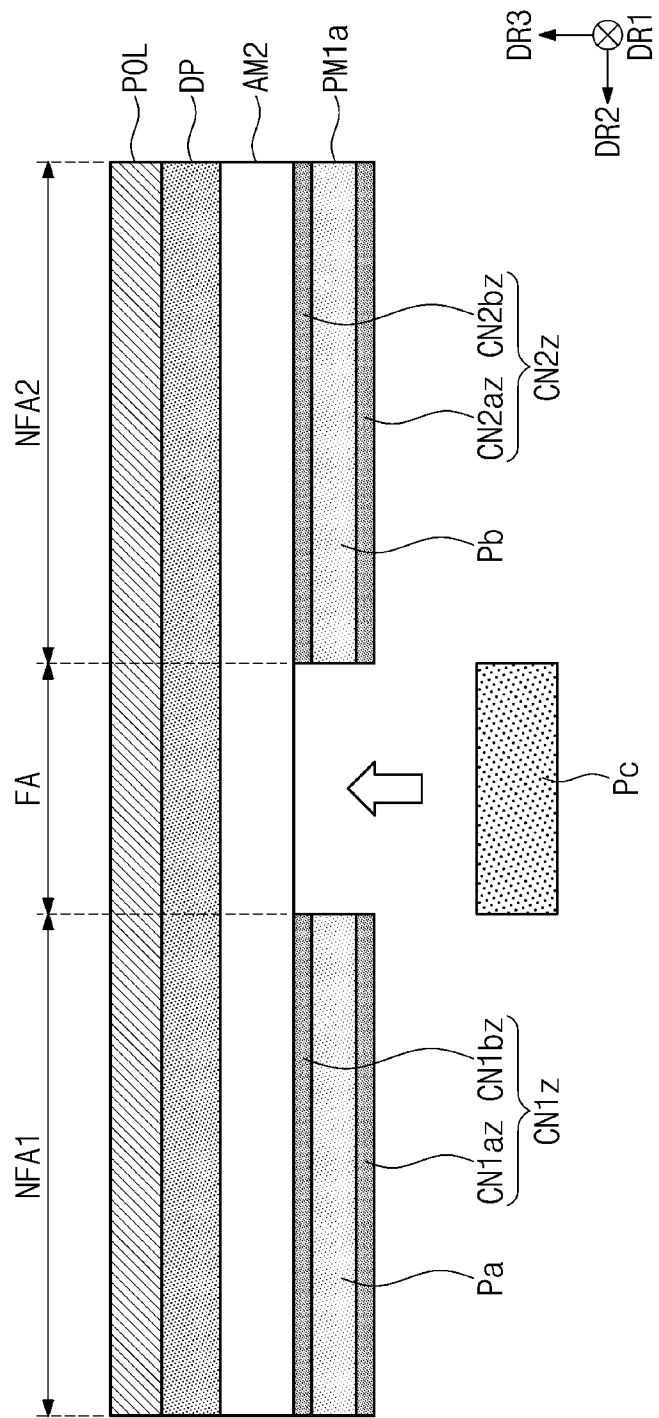

Referring to FIG. 10B, the first release paper RP1 and the second release paper RP2 are removed. In this case, the first support portion Pa is attached to a lower surface of a second adhesive layer AM2 overlapping the first non-folding area NFA1, and the second support portion Pb is attached to a lower surface of the second adhesive layer AM2 overlapping the second non-folding area NFA2.

A second supporter Pc may be disposed under the display panel DP overlapping a folding area FA. Hereinafter, the second supporter Pc is described as a third support portion. As the first release paper RP1 is removed, an empty space is defined between the first support portion Pa and the second support portion Pb, and the third support portion Pc is disposed in the empty space. According to the disclosure, the third support portion Pc may include a second material different from the first material. As described above, the first material may include polyethylene terephthalate (PET), and the second material may include a glass material.

As a result, the first support portion Pa and the second support portion Pb are disposed under the display panel DP by the same process, and the third support portion Pc is disposed under the display panel DP by a different process from that of the first support portion Pa.

Figure 10C:
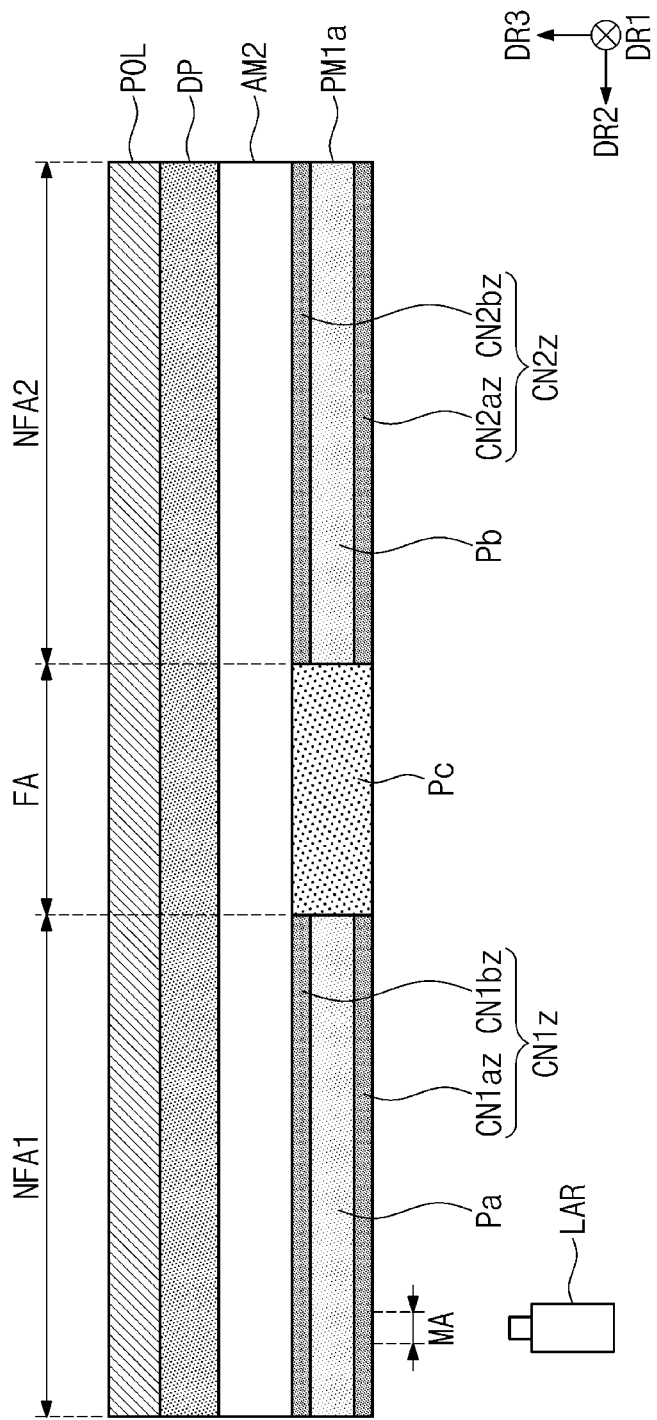

Referring to FIG. 10C, a laser device LAR is disposed under the support layer PM-1. The laser device LAR irradiates a laser beam to a module area MA in which the electronic module CM described with reference to FIG. 3 is disposed. In this case, the laser beam irradiated from the laser device LAR may have an intensity enough to penetrate through the first support portion Pa, the second adhesive layer AM2, the display panel DP, and an external light reflection member POL.

Figure 10D:
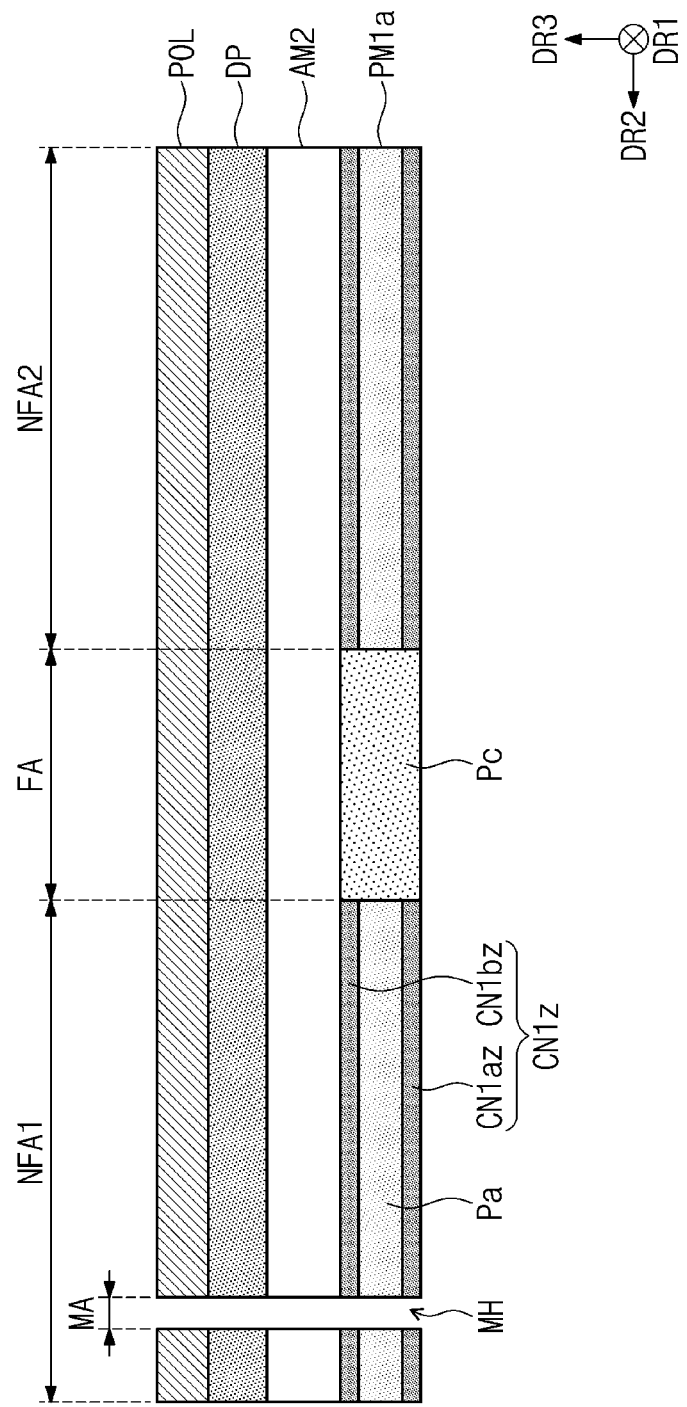

As a result, a module hole MH is defined in the first support portion Pa, the second adhesive layer AM2, the display panel DP, and the external light reflection member POL as shown in FIG. 10D.

However, the structure of the module hole MH is not limited thereto, and the intensity of the laser beam from the laser device LAR may be controlled in various ways according to the embodiment shown in FIGS. 9A and 9B.

Although the embodiments of the disclosure have been described, it is understood that the disclosure should not be limited to these embodiments but various changes and modifications can be made by one ordinary skilled in the art within the spirit and scope of the disclosure as hereinafter claimed.

Therefore, the disclosed subject matter should not be limited to any single embodiment described herein, and the scope of the claimed invention shall be determined according to the attached claims.

What is claimed is:
1. A display device comprising:
  a display panel comprising:
    a first non-folding area;
    a second non-folding area; and
    a folding area disposed between the first non-folding area and the second non-folding area and foldable with respect to a folding axis;
  an adhesive layer disposed under the display panel; and
  a support layer disposed under the adhesive layer, the support layer comprising:
    a first supporter overlapping the first non-folding area and the second non-folding area; and
    a second supporter overlapping the folding area, wherein
  the first supporter and the second supporter comprise different materials from each other,
  the second supporter comprises a glass material, and
  the first and second supporters are in a same plane.

2. The display device of claim 1, wherein a module hole is formed through the first supporter, the display panel, and the adhesive layer and overlaps at least one of the first non-folding area and the second non-folding area.

3. The display device of claim 2, wherein
  the display panel comprises a non-bending portion and a bending portion bent from the non-bending portion, and
  the first non-folding area, the second non-folding area, and the folding area overlap the non-bending portion of the display panel.

4. The display device of claim 3, wherein
  the support layer comprises an auxiliary supporter disposed on the bending portion, and the auxiliary supporter and the first supporter comprise a same material.

5. The display device of claim 4, wherein the auxiliary supporter overlaps one of the first non-folding area and the second non-folding area.

6. The display device of claim 2, wherein
the first supporter comprises:
a first support portion overlapping the first non-folding area; and
a second support portion overlapping the second non-folding area, and
each of the first support portion and the second support portion has an area greater than an area of the second supporter in a plan view.

7. The display device of claim 6, wherein the first support portion, the second support portion, and the second supporter have a same thickness in a thickness direction of the display panel.

8. The display device of claim 2, further comprising an antistatic layer comprising:
a first coating portion disposed between an upper surface of the first supporter and the adhesive layer; and
a second coating portion disposed on a lower surface of the first supporter.

9. The display device of claim 8, wherein the first supporter has a thickness greater than a sum of a thickness of the first coating portion and a thickness of the second coating portion in a thickness direction of the display panel.

10. The display device of claim 2, further comprising a camera module that overlaps the module hole and is disposed under the support layer.

11. The display device of claim 2, further comprising:
a polarizing layer disposed on the display panel; and
a window disposed on the polarizing layer,
wherein the module hole penetrates through the polarizing layer.

12. The display device of claim 1, wherein
the first supporter comprises a polymer film.

13. A display device comprising:
a display panel comprising a module area and a display area surrounding the module area;
an adhesive layer disposed under the display panel; and
a support layer disposed under the adhesive layer, wherein
a module hole is formed through the support layer, the adhesive layer, and the display panel, and overlaps the module area, and
the support layer comprises:
a first supporter surrounding the module hole in a plan view; and
a second supporter disposed adjacent to the first supporter and comprising a material different from a material of the first supporter, wherein
the second supporter comprises a glass material, and
the first and second supporters are in a same plane.

14. The display device of claim 13, wherein
the display area comprises a first non-folding area, a second non-folding area, and a folding area disposed between the first non-folding area and the second non-folding area and foldable with respect to a folding axis, and
the module hole overlaps one of the first non-folding area and the second non-folding area.

15. The display device of claim 14, wherein
the first supporter comprises a first support portion overlapping a portion of the first non-folding area and a second support portion overlapping a portion of the second non-folding area, and
the second supporter is disposed between the first support portion and the second support portion and overlaps the folding area, another portion of the first non-folding area, and another portion of the second non-folding area.

16. The display device of claim 15, wherein the second supporter has an area greater than an area of each of the first support portion and the second support portion in a plan view.

17. The display device of claim 14, wherein the second supporter overlaps each of the first non-folding area, the second non-folding area, and the folding area and surrounds the first supporter in a plan view.

18. The display device of claim 13, wherein
the first supporter comprises polyethylene terephthalate, and
the second supporter has a thickness equal to or greater than about 25 micrometers and equal to or smaller than about 75 micrometers.

19. A method of manufacturing a display device, comprising:
providing a display panel comprising a first non-folding area, a second non-folding area, and a folding area disposed between the first non-folding area and the second non-folding area and foldable with respect to a folding axis;
providing an adhesive layer under the display panel;
disposing a first support portion and a second support portion at a lower portion of the adhesive layer such that the first and second support portions respectively overlap the first non-folding area and the second non-folding area, the first and second support portions comprising a same material;
disposing a third support portion at the lower portion of the display panel to overlap the folding area, the third support portion comprising a material different from a material of the first and second support portions; and
forming a module hole penetrating through the display panel overlapping the first support portion and the first non-folding area by using a laser beam, wherein
the third support portion comprises a glass material, and
the first, second, and third support portions are in a same plane.

20. The method of claim 19, wherein
the first support portion and the second support portion are disposed at the lower portion of the display panel by a same process, and
the third support portion is disposed at the lower portion of the display panel by a different process from the first support portion.

* * * * *